US 6,714,558 B1

(12) United States Patent
Patel et al.

(10) Patent No.: US 6,714,558 B1
(45) Date of Patent: Mar. 30, 2004

(54) SYSTEM FOR IMPLEMENTING NETWORK PROTOCOLS BETWEEN DEVICES ON A PRINTED CIRCUIT BOARD

(75) Inventors: Sandeep A. Patel, Los Gatos, CA (US); Theresa A. Bradshaw, Morgan Hill, CA (US); Michael K. Pula, Naperville, IL (US); James R. Cowley, San Jose, CA (US)

(73) Assignee: 3Com Corporation, Santa Clara, CA (US)

( * ) Notice: Subject to any disclaimer, the term of this patent is extended or adjusted under 35 U.S.C. 154(b) by 0 days.

(21) Appl. No.: 09/386,742

(22) Filed: Aug. 31, 1999

(51) Int. Cl.[7] .............................................. H04L 12/413
(52) U.S. Cl. ........................ 370/445; 370/463; 710/100
(58) Field of Search ................................. 370/462, 438, 370/315, 362, 447, 352, 248, 425, 463, 464, 412, 445, 202; 709/270, 700, 249; 375/354, 220, 216, 222, 200; 713/600; 364/200; 711/148; 710/72, 100; 455/557; 717/178

(56) References Cited

U.S. PATENT DOCUMENTS 5,754,540 A * 5/1998 Liu et al. ..................... 370/315
6,298,067 B1 * 10/2001 Tang ........................... 370/462

* cited by examiner

Primary Examiner—John Pezzlo
(74) Attorney, Agent, or Firm—McDonnell Boehnen Hulbert & Berghoff

(57) ABSTRACT

A system enabling devices on a printed circuit board to communicate using network communication protocols over the communication medium provided on a circuit board. Disclosed are means for interfacing devices to differential traces on the printed circuit board such that a network communication protocol can be implemented over the traces on a printed circuit board. A hub system is also disclosed to regulate access to a shared communication medium and allow a plurality of devices to communicate over the shared communication medium. Exemplary systems are described.

16 Claims, 5 Drawing Sheets

SYSTEM FOR IMPLEMENTING NETWORK PROTOCOLS BETWEEN DEVICES ON A PRINTED CIRCUIT BOARD

FIELD OF THE INVENTION

This invention relates to electronic communication systems, and more particularly to a system and method for providing network connections between devices on a printed circuit board.

BACKGROUND OF THE INVENTION

The IEEE 802.3 specification is one example of a network communication protocol allowing a plurality of different computer devices to communicate over a local area network ("LAN") connected by copper wire cabling. Originally, IEEE 802.3 specified the use of 50 ohm coaxial cable of 0.4 inch diameter carrying data at rates up to 10 Mbps, which became know as 10Base5 cabling or "thick" ethernet. Thick ethernet, however, proved expensive and inflexible for a number of smaller network applications. Subsequently, a number of lower cost variations of the basic thick ethernet protocol has been provided. As recommended by a number of new standards, various different types of cabling have been used such as 10Base2 cabling or "thin" ethernet and even and ordinary unshielded twisted pair wiring ("UTP") which is known as 10Base-T ethernet. In other embodiments, 100 Base-T also works on UTP.

Each of these different flavors of network protocols is designed to allow computing devices to connect and communicate over different physical distances. Thick ethernet cabling allows runs to connect machines separated up to 500 meters, where thin ethernet allows cable runs up to 200 meters and 10base-T and 100 Base-T ethernet allows cable runs 100 meters from the hub.

With computer LANs becoming more widespread, the use of network protocols has greatly increased as well and are now widely utilized for a variety of various LAN applications. To date, however, ethernet protocols have been largely utilized to connected different computing devices over a length of cable or copper wiring. As the level of integration of electronic devices continues to increase and the size of computing devices continues to decrease, network protocols may find a number of new applications.

SUMMARY OF THE INVENTION

According to the embodiments of the present invention, the ability to utilize networking protocols to communicate between different electronic devices is significantly extended. The present embodiment allows networking protocols to be implemented over different types of physical transmission medium.

In a particular embodiment, a network protocol connection can be implemented between electronic devices situated on the same printed circuit board ("PCB") over a physical communication medium on the PCB board. In this embodiment, electronic devices situated closely together on the same PCB can communicate using a network communication protocol such as ethernet 10/100Base-T network protocols originally designed to provide communications in a local area network. The physical communication medium may include conductive traces etched onto a PCB.

According to an exemplary embodiment of the invention, a matching network is utilized to interface a Medium Access Control (MAC) block providing network protocol functions to the physical communication layer of the PCB. In the exemplary embodiment, the matching network enables the MAC block to implement a network protocol connection on the physical communication medium of a PCB. The matching network provides isolation and the proper electrical characteristics to interface with and implement networking protocols on the particular communication medium. For example, the matching networks isolate and electrically match the characteristic impedance of the differential traces etched on a PCB.

According to another aspect of the invention, a hub device provides communications between a plurality of electronic devices on a PCB using a networking protocol. The hub allows a greater number of devices to access and communicate over a shared physical communication medium. In an exemplary embodiment, a collision detect block indicates when more than one device is attempting to transmit on the shared communication medium to arbitrate access between a plurality of device communicating on the shared medium.

According to yet another aspect of the invention, the need for a repeater and repeater state machine is eliminated. Implementing local area network protocols on a PCB reduces the distance between networked devices and signal propagation delays, eliminating the need for the repeater and repeater state machines normally necessary for handling signals travelling over greater physical distances.

The present invention extends the use of local area networking protocols, such as the ethernet protocol. In the illustrative embodiments, networking protocols can be implemented between smaller electronic devices situated closely on a printed circuit board. Simplification of the electronic circuitry required to implement networking protocols allow easier and more inexpensive communication between electronic devices. This also allows the use of existing off-the-shelf integrated circuits to be used such that the product development cycle is reduced. Wider use of network protocols allows easier implementation of communication between devices as integration of electronic devices continues to increase.

The foregoing and other features and advantages of preferred embodiments of the present invention will be more readily apparent from the following detailed description. The detailed description proceeds with references to the accompanying drawings.

BRIEF DESCRIPTION OF THE DRAWINGS

The exemplary embodiments of the present inventions are described with reference to the following drawings, wherein.

DETAILED DESCRIPTION OF PREFERRED EMBODIMENTS

Figure 1:
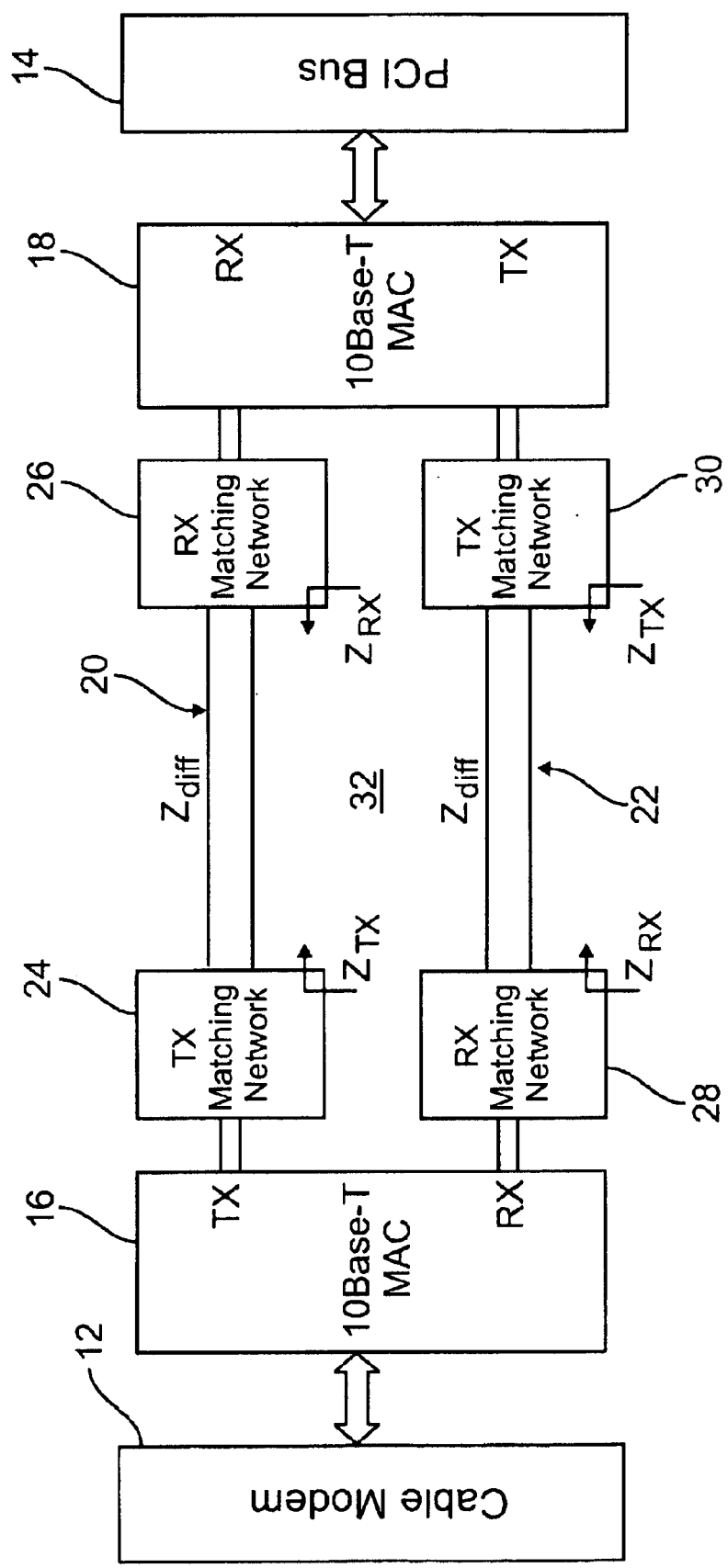
FIG. 1 is a schematic block diagram of an embodiment of the networking connection implemented between two network interfaces situated on a printed circuit board.

FIG. 1 is a schematic block diagram of an embodiment of the novel ethernet connection implemented on a printed circuit board 10. Utilizing the exemplary embodiment, two devices with Medium Access Control ("MAC") interfaces on the same printed circuit board ("PCB") can be connected and communicate using a network protocol connection. In this exemplary embodiment, the ethernet connection enables communication between a cable modem 12 and a PCI bus 14. The cable modem 12 and PCI bus 14, for example, utilize the 10Base-T MAC blocks 16, 18 to implement network communication protocols over a shared physical transmission medium such as trace pairs 20, 22 on the printed circuit board.

The MAC blocks 16, 18 preferably implement standard network communication protocols to allow computing devices or interface communication buses such as the cable modem 12 and PCI bus 14 to communicate over a shared physical transmission medium in an orderly fashion. In general, the medium access control procedure may implement a variety of different network protocols such as a 10/100Base-T ethernet protocol using CSMA/CD (Carrier Sense Multiple Access/Collision Detect), Token Ring, etc. The 10Base-T MAC blocks 16, 18 in this example are implemented by 3Com MAC application specific integrated circuit (ASIC) that implements the 802.3 10 Base-T ethernet protocol. The MAC block on the Cable Modem side is a 10 BASE-T to an ISA bus ASIC and the MAC block on the PCI side is a 10 Base-T to PCI.

In this embodiment, the physical transmission medium is preferably embodied by the trace pairs 20, 22 typically etched on the PCB board 32. The PCB traces 20, 22 are preferably conductive traces and in the exemplary embodiment are preferably operated in differential mode to carry electrical communication signals such as digital signal levels. One differential pair may be used for each Transmit-Receive pair and two pairs 20, 22, as shown in FIG. 1, provide bi-directional communication. The differential PCB trace pairs can be embodied by, for example, two 50 ohm PCB traces operating in 100 ohm differential mode. Differential mode provides protection from common-mode noise appearing on the PCB traces.

The 10 Base-T MAC blocks 16, 18 are interfaced by Transmit (Tx) and Receive (Rx) Matching Networks 24, 26, 28 and 30 to the physical communication medium. In this embodiment, PCB traces 20, 22 provide a communication path between the devices on the PCB. The Tx and Rx Matching Networks 24–30 are implemented to provide the proper electrical characteristics to interface with the physical communication medium to receive signals and implement the necessary communication protocol functions such as CSMA/CD. The matching network 24–30 is configured to provide the proper input and output impedance to drive and receive electrical signals on the PCB traces. For example, the matching networks 24–30 electrically match the characteristic impedance of the differential pairs 20, 22. The characteristics of physical transmission lines are well known to those skilled in the art. To achieve maximum power transfer between the differential transmission line and either a source or a load, a matching network is used. There are various methods of designing matching networks depending on the frequency content of the signals carried on the transmission line. For a 10/100 Base-T network protocol, a lumped element network can be synthesized using filter tables or can derived from a Smith Chart. The characteristic impedance ($Z_o$) can be obtained through measurement or from tables. Typically, the variables that are used for a given PCB dielectric constant are thickness of the PCB trace, width of the PCB trace, distance from the ground plane of the PCB traces and distance between the differential pairs.

Figure 2:
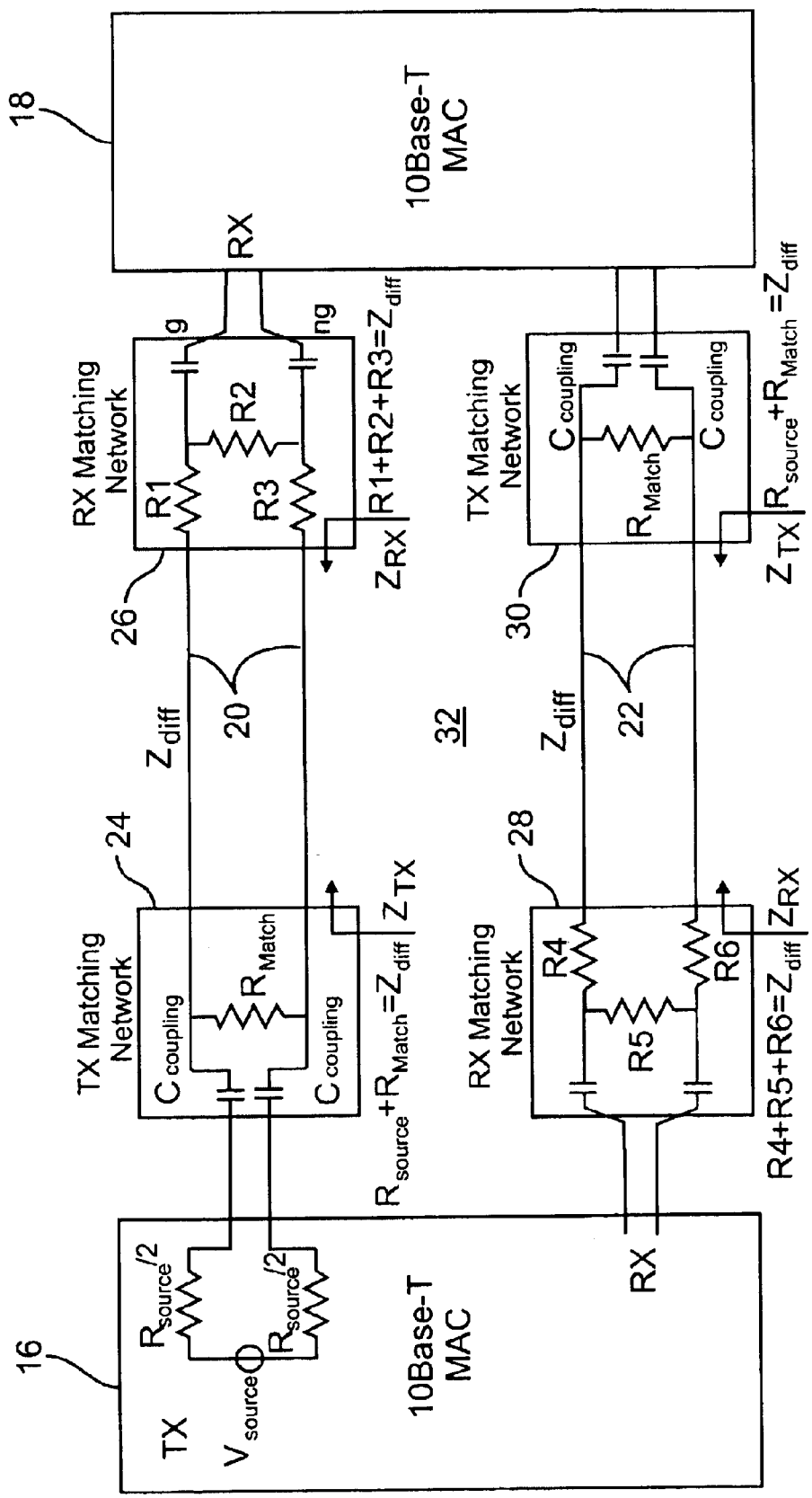
FIG. 2 show a more detailed view of the printed circuit board interface in the system of FIG. 1.

FIG. 2 shows a more detailed view of the network connection interface to the PCB traces 20, 22 in the exemplary embodiment. As shown in FIG. 2, the MAC block 16 is driven by $V_{source}$ and has an output impedance and represented by the two resistors identified as $R_{source}/2$. Essentially, the source impedance of a driver should equal the characteristic impedance of the differential pair being driven. Preferably, the TX matching network 24 matches the output impedance of the MAC block 16 to the trace pair 20 to allow the MAC block 16 to match the impedance $Z_{diff}$ of the PCB trace 20. In this drawing, the matching network 24 is represented as coupling capacitors $C_{coupling}$ to provide isolation and the resistor $R_{match}$ to match the output impedance of the MAC block with the PCB trace 20. $R_{match}$ is thus selected according to $R_{source}+R_{match}=Z_{diff}$. The TX matching network 30 for the MAC block 18 operates in a similar fashion to allow the MAC block 18 to transmit over the PCB trace 22. It should be understood that in certain embodiments $R_{source}$ may already be equal to $Z_{diff}$, thus eliminating the need for $R_{match}$.

The RX matching networks 26, 28 operate to interface the PCB traces 20, 22 to the input of the MAC blocks 16, 18. The RX matching networks 26, 28 as shown as including three resistors R1–R3 and R4–R6. Preferably, R1–R3 and R4–R6 are chosen such that R1+R2+R3=$Z_{diff}$ and R3+R5+R6=$Z_{diff}$.

Figure 3:
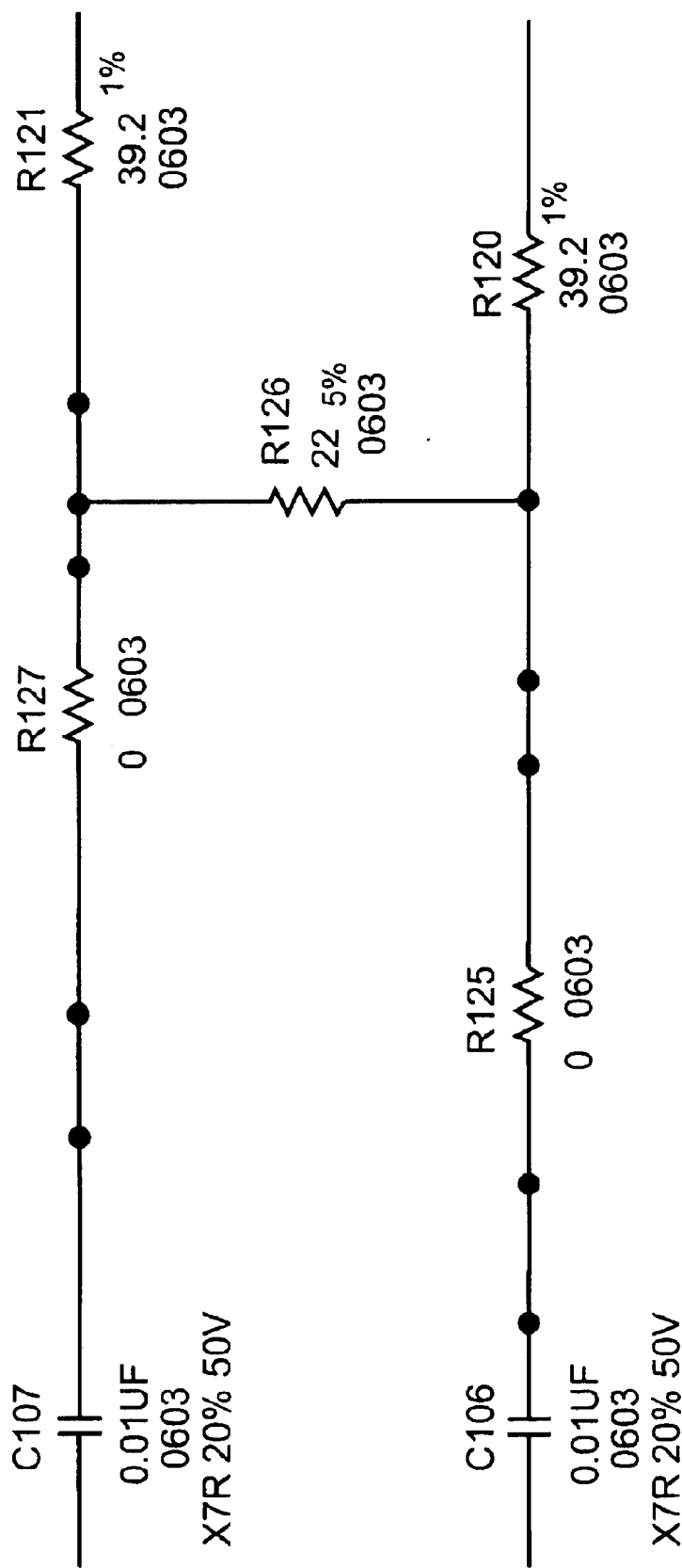
FIG. 3 show a further drawing of the circuitry of the matching interface in the system shown in FIGS. 1 and 2.

FIG. 3 shows a more detailed exemplary implementation of the Rx Matching Network 26–28 using discrete electrical components. It should be understood that the matching networks 26–28 may provide a number of line interface and connection functions and be implemented in a variety of other forms including discrete and integrated circuitry. In the exemplary embodiment, series capacitors 40, 42 provide line isolation typically provided by isolation transformers in a 10Base-T Ethernet system. The series capacitors 40, 42 in this illustrative embodiment are of a 0.01 uFarad value with a 50 volt rating to provide an effective low cost isolation. Of course in other embodiments, isolation may be provided by other devices such as transformers, optical isolation, etc.

The Rx matching networks 26–28 also include a resistor network providing the appropriate impedance matching, signal levels and biasing for the PCB differential trace pairs 20, 22. In the exemplary embodiment of FIG. 3, resistors R120, R121, R125, R126 and R127 provide the appropriate signal level biasing to interface the MAC blocks 16, 18 to the trace pairs 20, 22. For example, IEEE 802.3 MAC devices are implemented to provide appropriate signal levels for data transmission over various media such as RG85 coaxial cable, category 3, 4, 5 unshielded twisted pair ("UTP") and even fiber optic cable. The Rx Matching Networks 26–28 allow the 10Base-T MAC devices to interface, transmit and communicate over PCB traces such as the differential 100 ohm PCB traces of the present embodiment. The sum of R121, R120 and R126 equal the characteristic impedance of the differential pair. Because they need to form a differential attenuator, the values of R121 and R120 are equal. The attenuation ratio equals R126/(R120+R121+R126). The series capacitors C107 and C106 provide AC coupling to the receiver.

When a port is transmitting, its Rx buffer operates according to the equation RX_Buff(N)=Collision+!TX_BUFF (N), replacing the more complicated repeater state machine in the 802.3 standard. Typically, the repeater state machine in the 802.3 standard, for example, allows for one port of the repeater to send traffic to all other ports without sending to the receiving port. Because there is significant propagation delay in the typical network, the repeater state machine in the 802.3 standard must extend collisions to 64 bytes so all devices on the network can sense the collision before others on the network can transmit. The 802.3 repeater standard also specifies the 'one port left' concept whereby, the repeater will transmit a Jam signal to all ports until there is only one port involved in a transmit collision. In the exemplary embodiment of network protocols over the PCB, the network delays are negligible so extending collisions and dealing with the concept of 'one port left' are not required. The repeater function can be boiled down to the point where the state of the transmitter and receiver for a given port N can be described as: the receiver for port N will be active as long as Port N is not transmitting and that the received for port N will always be active when there is a collision in the network. This can be summarized in the following equation: RX_Buff(N)=Collision+!TX_BUFF(N).

It should be understood that in addition to 10/100Base-T protocols referred to above, other types of networking protocols suitable for UTP can also be used with the exemplary embodiment. For example, Token Ring, FDDI over copper, and 1000Base-T are capable of being used in the present embodiment.

In typical communication networks, a plurality of different network devices may be connected to the physical transmission layer using a repeater or hub device. These repeater or hubs allow network transmission signals to be regenerated so that they can be transmitted over greater physical distances, as well as, allowing multiple CPE devices to share the same physical communication medium. Currently, this may be implemented in many systems using a repeater ASIC enabling a multiple number of connections from various CPE devices.

Figure 4:
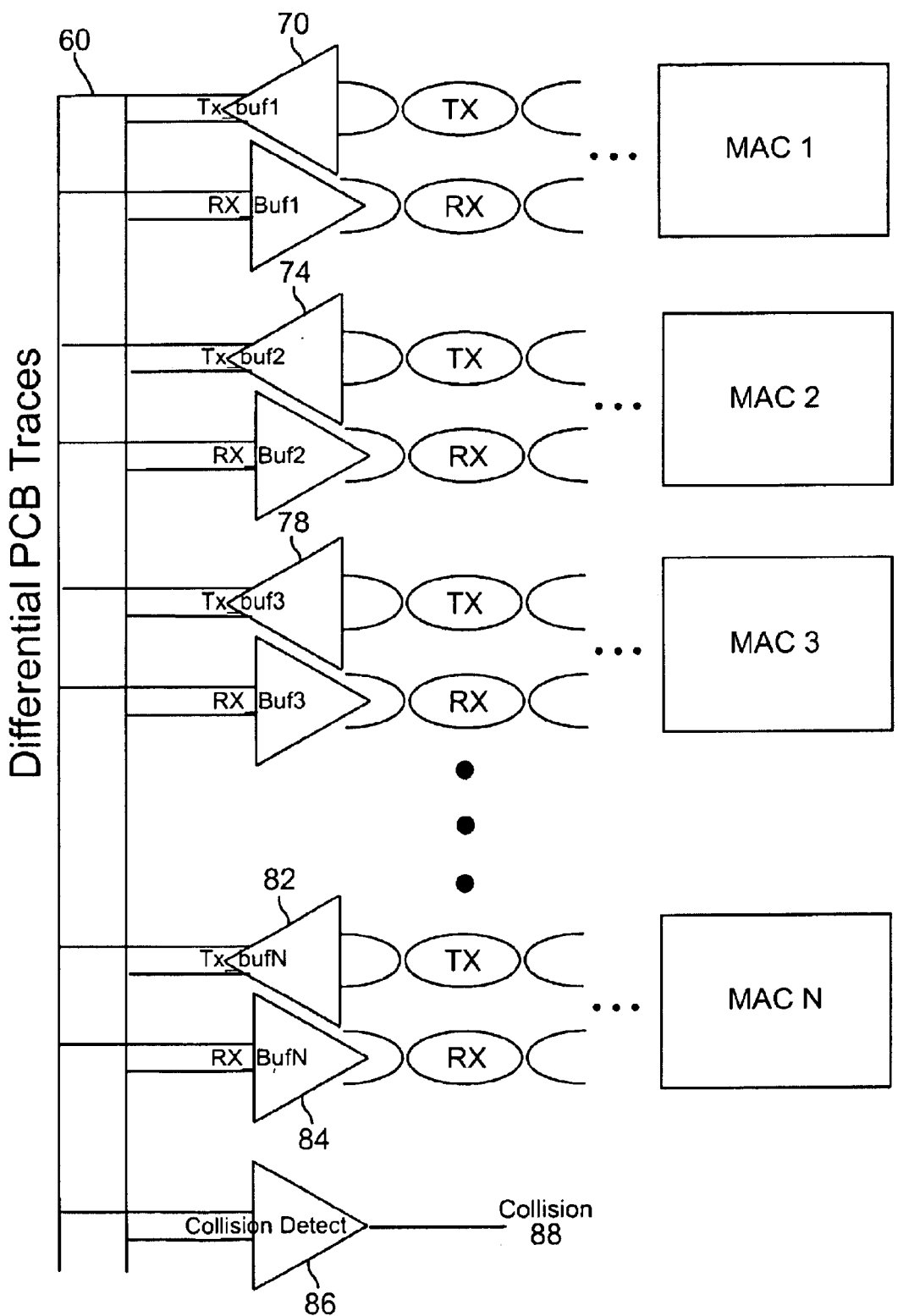
FIG. 4 shows another embodiment utilizing a hub device to implement network connections between a plurality of devices on the same printed circuit board.

Referring now to FIG. 4, a plurality of different devices with network MAC devices on the same PCB can communicate to each other over the PCB using the network protocols. As seen in FIG. 4, the PCB trace pair 60 provides a shared physical communication medium for a plurality of electronic devices to connect to and communicate to each other. Each of the trace pairs 62–68 from the communication devices are interfaced to the shared PCB trace pair 60 by Tx and Rx buffers 70–84. The Tx and Rx buffers 70–84 interfacing the PCB trace pairs 70–84 to the shared PCB trace pair 60 can be implemented in a variety of different ways, including circuitry similar to those shown in FIGS. 2 and 3. The Rx buffer for a given device is always enabled unless that port is transmitting. A given receiver or Rx buffer will receive signals from the differential pair 60 when either the collision output 88 is active or 'true' or the transmitter for port N is active.

FIG. 4 also shows a collision detect sensor 86 provided to implement the CSMA/CD (Carrier Sense Multiple Access/ Collision Detect) utilized in the ethernet protocol. On a shared physical communication medium, collisions may occur when two devices attempt to transmit over the physical communication medium at the same time, resulting in garbled transmissions. The MAC devices preferably implement an IEEE 802.3 ethernet protocol using CSMA/CD to allow multiple access of a shared communication medium such as the PCB trace pair 60. CSMA/CD output signal 88 can be used to regulate access to a shared physical medium such that only one device will attempt to transmit on the shared medium at any time. Collisions can be handled in a variety of different ways according to the particular protocol implemented.

In the exemplary embodiment, the collision detect sensor 86 is provided to detect when more than one device is transmitting on the physical communication medium and then outputting 88 a specific (high or low) logic signal to indicate when transmissions are occurring on the physical medium. Preferably, the collision detect sensor 86 monitors the physical communication medium, in this case the differential PCB traces 60 for signal levels exceeding a receive squelch level higher than a transmitter's output level. When a single device or port is transmitting the signal level on the shared bus will typically be less than 2.6 volts. On the other hand, when more than one port or device is transmitting the signal level on a differential PCB trace may exceed 2.8 volts. In the current embodiment, the collision detect sensor 86 may be implemented with a logic gates such as an AND, NAND, OR, or NOR gate to sense signal levels on the pair of PCB traces 60. The inputs of the collision detect sensor 86 is supplied from each of the pair of PCB traces 60. Thus, the collision detect sensor 86 can detect transmission on the PCB traces 60. Transmission from more than one of the of the ports connected to the PCB traces will cause the collision detect sensor 86 to activate, indicating a collision on the PCB trace 60. The collision detect sensor 86 preferably outputs a signal 88 to indicate a collision. The appropriate network protocol can then respond to the collision according to the protocol.

Figure 5:
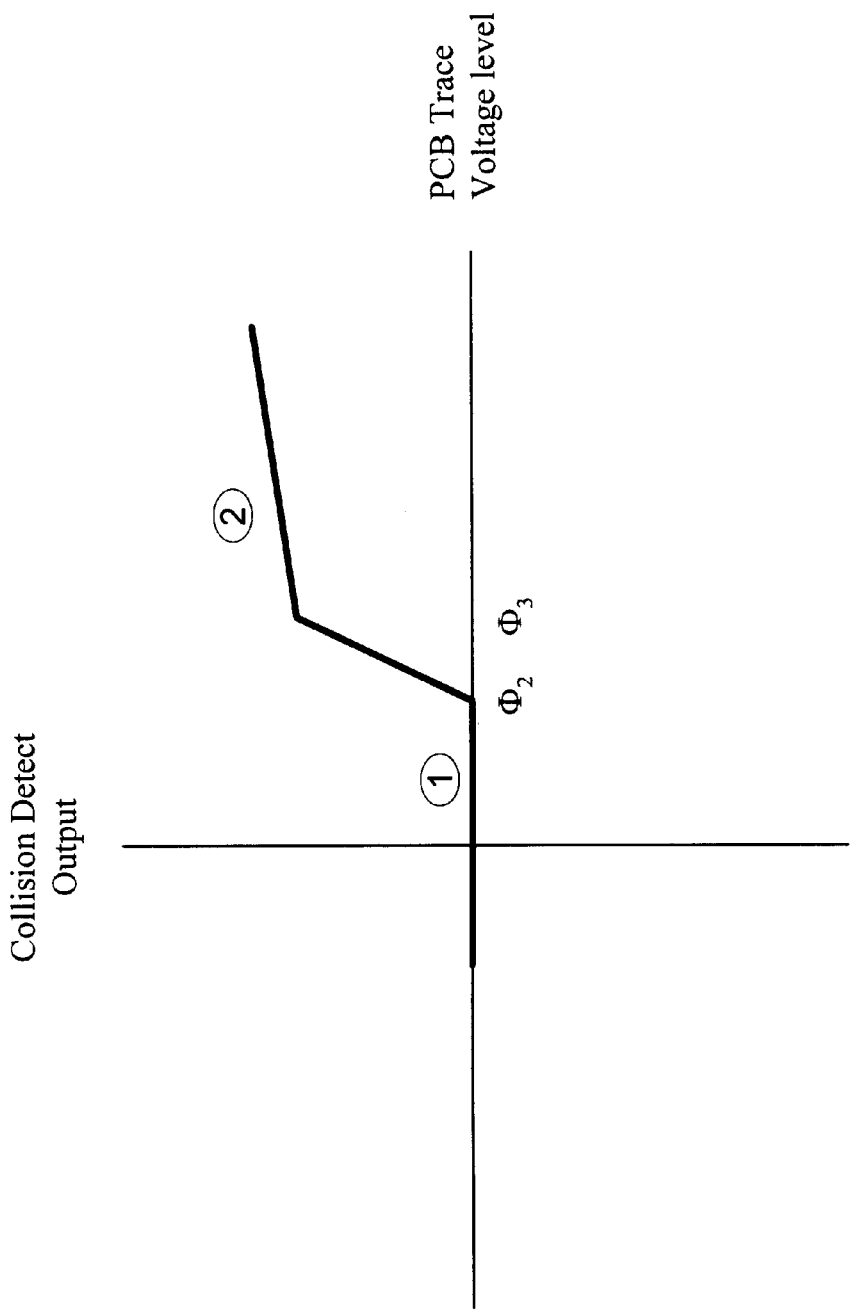
FIG. 5 shows the response diagram of the collision detect sensor of FIG. 4.

FIG. 5 shows an exemplary embodiment of the signal levels that can be used to detect collisions on the communication medium. As seen the in the chart of FIG. 5, a voltage signal level between 0 and 2.6 volts in section 1 results in no collision being detected. As the voltage on the differential PCB traces approaches 2.7 volts at A, the output of the collision detector begins swings to the high logic state in section 2 of this example, indicating a collision of transmissions on the PCB trace 60.

The hub embodiment of FIG. 4 allows a greater number of devices to access and communicate over a shared physical communication medium.

The present embodiments extend the use of network communication protocols to different communication medium. The embodiments allow networking protocols to be implemented between devices on a printed circuit board. A network protocol such as an ethernet protocol can be implemented between devices on the same PCB to allow the devices to communicate with each other via traces in the PCB. The matching networks allow the MAC block implementing the network protocol to interface with the traces on the PCB and provide networking communication protocols over the PCB. Utilizing the present embodiments and variations thereof, the use of network protocols is significantly extended. Networking protocols can be implemented between smaller electronic devices situated closely together on a printed circuit board. Simplification of the electronic circuitry required to implement networking protocols allow easier and more inexpensive communication between electronic devices. This also allows the use of existing off-the-shelf integrated circuits to be used such that the product development cycle is reduced. Wider use of network protocols allows easier implementation of communication between devices as integration of electronic devices continues to increase.

It should be understood that the programs, processes, methods and systems described herein are not related or limited to any particular type of computer or network system (hardware or software), unless indicated otherwise. Various types of general purpose or specialized computer systems may be used with or perform operations in accordance with the teachings described herein.

In view of the wide variety of embodiments to which the principles of the present invention can be applied, it should be understood that the illustrated embodiments are exemplary only. The illustrated embodiments should not be taken as limiting the scope of the present invention.

The claims should not be read as limited to the described order or elements unless stated to that effect. Therefore, all embodiments that come within the scope and spirit of the following claims and equivalents thereto are claimed as the invention.

We claim:

1. A system for enabling devices on a printed circuit board to communicate using a network protocol, comprising:
    a first device having a first MAC block, wherein the first device is situated on the printed circuit board;
    a second device having a second MAC block, wherein the second device is on the printed circuit board in communication with the first device;
    a trace pair in the printed circuit board providing a communication path between the first device and the second device, wherein the first and second MAC blocks implement a network protocol over the trace pair to provide communication between the first device and the second device; and
    a matching network interfacing the first and second MAC blocks to the trace pair in the printed circuit board, the matching network providing line isolation.

2. The invention of claim 1 wherein the network protocol comprises an ethernet protocol.

3. The invention of claim 2 wherein the ethernet network protocol is according to the IEEE 802.3 specification.

4. The invention of claim 1 wherein the network protocol comprises a 10Base-T protocol.

5. The invention of claim 1 wherein the network protocol comprises a 100 Base-T protocol.

6. The invention of claim 1 wherein the network protocol comprises a 1000 Base-T protocol.

7. The invention of claim 1 wherein the trace pair operates as a differential trace pair.

8. The system of claim 1 wherein the first device is a cable modem and the second device is a system bus.

9. The system of claim 1 wherein the matching network further comprises a differential attenuator.

10. The system of claim 1 wherein the matching network further comprises a shunt resistor.

11. The system of claim 1 wherein the matching network is a Rx matching network.

12. A hub system for allowing a plurality of devices to communicate over a printed circuit board using network protocols, comprising:
    a shared communication medium providing communication access between the plurality of devices;
    a plurality of buffers providing the plurality of devices access to the shared communication medium; and
    a collision detector monitoring the shared communication access to provide an indication when more than one device is transmitting on the shared communication medium, wherein the collision detector enables network protocols to be communicated over the shared communication medium.

13. The invention of claim 12 wherein the network protocol implements a CSMA/CD.

14. The invention of claim 12 wherein the network protocol comprises an ethernet protocol.

15. The invention of claim 12 wherein the buffers include logic to determine when the buffer is active.

16. The invention of claim 15 wherein the logic determines when the buffer is active according to $RX\_Buff(N) = Collision + !TX\_BUFF(N)$.

* * * * *